(12) United States Patent
Zhang

(10) Patent No.: US 10,863,153 B2
(45) Date of Patent: Dec. 8, 2020

(54) FULLY SEALED LIQUID CRYSTAL PROJECTION OPTICAL UNIT DEVICE WITH HIGH-EFFICIENCY HEAT DISSIPATION FUNCTION

(71) Applicant: Luxnpro Chengdu Electronics Co., Ltd, Chengdu (CN)

(72) Inventor: Jin Zhang, Chengdu (CN)

(73) Assignee: LUXNPRO CHENGDU ELECTRONICS CO., LTD, Chengdu (CN)

( * ) Notice: Subject to any disclaimer, the term of this patent is extended or adjusted under 35 U.S.C. 154(b) by 0 days.

(21) Appl. No.: 16/792,327

(22) Filed: Feb. 17, 2020

(65) Prior Publication Data
US 2020/0267357 A1 Aug. 20, 2020

(30) Foreign Application Priority Data
Feb. 15, 2019 (CN) .......................... 2019 1 0116949

(51) Int. Cl.
*H04N 9/31* (2006.01)
*G02F 1/1333* (2006.01)
*H05K 7/20* (2006.01)

(52) U.S. Cl.
CPC ..... *H04N 9/3144* (2013.01); *G02F 1/133385* (2013.01); *H05K 7/20336* (2013.01)

(58) Field of Classification Search
USPC ........................................................ 349/161
See application file for complete search history.

(56) References Cited

FOREIGN PATENT DOCUMENTS

CN 201359674 Y 12/2009

*Primary Examiner* — Edward J Glick
*Assistant Examiner* — David Y Chung
(74) *Attorney, Agent, or Firm* — McClure, Qualey & Rodack, LLP

(57) ABSTRACT

A fully sealed liquid crystal projection optical unit device with a high-efficiency heat dissipation function includes: a hermetically sealed housing having an accommodation space therein; a light source, a first heat pipe radiator module, a first heat dissipation fan and a second heat dissipation fan, which are disposed outside the hermetically sealed housing; a first optical module, a second optical module and a liquid crystal screen, which are installed in the hermetically sealed housing; and a second heat pipe radiator module and a driving fan, wherein the first heat dissipation fin is fixedly installed outside the hermetically sealed housing and located close to the second heat dissipation fan, the second heat dissipation fan is in communication with the first heat dissipation fin through an air duct, and the first heat dissipation fin is in communication with the second heat dissipation fin directly or through the heat pipe.

19 Claims, 1 Drawing Sheet

FULLY SEALED LIQUID CRYSTAL PROJECTION OPTICAL UNIT DEVICE WITH HIGH-EFFICIENCY HEAT DISSIPATION FUNCTION

CROSS REFERENCE TO THE RELATED APPLICATIONS

This application is based upon and claims priority to Chinese Patent Application No. 201910116949.0, filed on Feb. 15, 2019, the entire contents of which are incorporated herein by reference.

TECHNICAL FIELD

The present invention belongs to the technical field of heat dissipation in optical projection devices, and in particular relates to a fully sealed liquid crystal projection optical unit device with a high-efficiency heat dissipation function.

BACKGROUND

With the continuous development and progress of the electronic technology, projectors are widely used in daily life. A projector, also known as a projection machine, is an apparatus that can project an image or a video onto a curtain, and can be connected to a computer, a VCD, a DVD, a BD, a game console, DV or the like through different types of interface for playback of corresponding video signals. LCD liquid crystal projectors are one type of projector. The LCD liquid crystal projectors have the advantages of good colour reproduction, high resolution, small size and light weight, are also very convenient to early, and are a mainstream product in the current projector market.

At present, a projection device based on the single-chip LCD liquid crystal technology generally comprises a light source component (for example, a light source, a reflective cup, etc.), an incident light guide component (such as a convex lens, a condenser lens, a reflective cup, a light cone, an incident Fresnel lens, etc.), an LCD screen, and an output Fresnel lens and lens set. However, for an imaging Fresnel lens and lens set, there is a defect of incapability of sealing, so as to be unable to achieve both dust-proofing and heat dissipation functions. Therefore, this causes problems of the projection device, such as inconvenient maintenance, short maintenance period and high cost.

In a fully enclosed heat dissipation device disclosed in the patent for invention with the application number CN 200920079551.6, a fan is installed underneath or at a side of a hermetically sealed heat dissipation frame in front of a light receiving surface of a liquid crystal screen, an air inlet of the fan unit is in communication with an inner cavity of the heat dissipation frame, an air outlet of the fan extends into the heat dissipation frame and forms an angle of inclination with the liquid crystal screen, and a rear side plate of the heat dissipation frame is made of a transparent material, or a light source is disposed in front of the inner cavity of the heat dissipation frame. It can be seen from the analysis that on the heat dissipation structure disclosed, the heat from the inside of the camera is mainly received by means of the hermetically sealed cavity itself, and is then dissipated by radiation and natural convection, so as to have the disadvantages of small transferred heat energy, low heat exchange efficiency, poor heat dissipation effect, and failing to satisfy the high-power requirements. Similarly, any method that does not enhance heat dissipation but entirely or partially replaces the hermetically sealed cavity with metal or other materials as well as changes the thickness or shape to achieve heat dissipation has the same basic principle, that is, heat exchange is achieved by means of radiation and natural convection.

SUMMARY

It is an object of the present invention to provide a fully sealed liquid crystal projection optical unit device with a high-efficiency heat dissipation function. By means of rapidly transferring the internal heat to the outside and enhancing heat dissipation at the outside, the heat exchange efficiency and heat radiation efficiency can be effectively improved, thereby improving the heat dissipation effect.

The fully sealed liquid crystal projection optical unit device with a high-efficiency heat dissipation function provided by an embodiment of the present invention comprises:

a hermetically sealed housing having an accommodation space therein; a light source, a first heat pipe radiator module, a first heat dissipation fan and a second heat dissipation fan, which are disposed outside the hermetically sealed housing; a first optical module, a second optical module, and a liquid crystal screen located between the first optical module and the second optical module, which are installed inside the hermetically sealed housing; and a second heat pipe radiator module comprising a first heat dissipation fin, a heat pipe and a second heat dissipation fin, wherein the first heat pipe radiator module is installed near the light source, the first heat dissipation fan and the second heat dissipation fan are respectively installed between the light source and the hermetically sealed housing, the first heat dissipation fan and the second heat dissipation fan are located on an inner side of the first heat pipe radiator module, the first heat dissipation fin is fixedly installed outside the hermetically sealed housing, the second heat dissipation fan is in communication with the first heat dissipation fin through an air duct, the first heat dissipation fin is in communication with the second heat dissipation fin directly or through the heat pipe, the second heat dissipation fin is located at sides of the first optical module, the second optical module and the liquid crystal screen and is fixedly installed to an inner wall of the hermetically sealed housing, and the light source is coupled to the first optical module through a light cone guide body.

Further, a driving fan for internal circulation is further installed inside the hermetically sealed housing, and the driving fan is used for driving the internal circulation of air flow within the hermetically sealed housing.

Further, a first reflector and a second reflector are further installed inside the hermetically sealed housing, and the first reflector is disposed close to the second optical module.

Further, a projection lens set is further installed on an outer wall of the hermetically sealed housing, the projection lens set is fixed to the hermetically sealed housing through an opening provided in the hermetically sealed housing, the second reflector is disposed close to the projection lens set, and the first heat dissipation fan and the second heat dissipation fan are disposed below the projection lens set.

Further, both of the first heat dissipation fan and the second heat dissipation fan are connected in series with the first heat dissipation fin to implement active heat dissipation.

Further, the hermetically sealed liquid crystal projection optical unit device comprises an air duct disposed between the second heat dissipation fan and the first heat dissipation fin.

Further, one end of the air duct is respectively disposed on the first heat dissipation fan and the second heat dissipation fan, and the other end is in communication with the first heat dissipation fin, so as to enhance heat dissipation.

Further, the hermetically sealed housing is made of a plastic and/or metal material.

Further, the light source is an LED light source.

In summary, compared with the prior art, the present invention has the beneficial effects as follows.

1. The first heat dissipation fin is fixedly installed outside the hermetically sealed housing, and the second heat dissipation fin is located at sides of the first optical module, the second optical module and the liquid crystal screen and fixedly installed to the internal wall of the hermetically sealed housing and disposed outside the hermetically sealed housing. The air that is circulating inside passes through the first optical module and the second optical module and will absorb the heat to raise the temperature, and the air with increased temperature passes through the second heat dissipation fin again and transfers the heat to the second heat dissipation fin. Because the second heat dissipation fin is in communication with the first heat dissipation fin directly or through the heat pipe, the heat is allowed to be transferred from the inside to the outside of the hermetically sealed housing.

2. The first heat pipe radiator module is installed near the light source, the first heat dissipation fan and the second heat dissipation fan are respectively installed between the light source and the hermetically sealed housing, and the first heat dissipation fan and the second heat dissipation fan are located on one or both sides of the first heat pipe radiator module, so that due to the externally enhanced heat dissipation, the heat may not be accumulated.

3. A hermetically sealed housing having an accommodation space therein is used, and the first optical module, the second optical module, the liquid crystal screen, the first reflector, the second reflector, etc. are installed in the hermetically sealed housing, so that the enclosure of the imaging system inside the fully sealed liquid crystal projection optical unit device can be implemented.

BRIEF DESCRIPTION OF THE DRAWINGS

In order to illustrate the technical solution of embodiments of the present invention more clearly, the drawings used in the embodiments will be briefly introduced below. It should be understood that the following drawings only show some embodiments of the present invention, and therefore should not be regarded as a limitation on the scope. For those of ordinary skill in the art, other related drawings can be obtained according to these drawings without involving any inventive effort.

REFERENCE SIGNS

Figure 1:
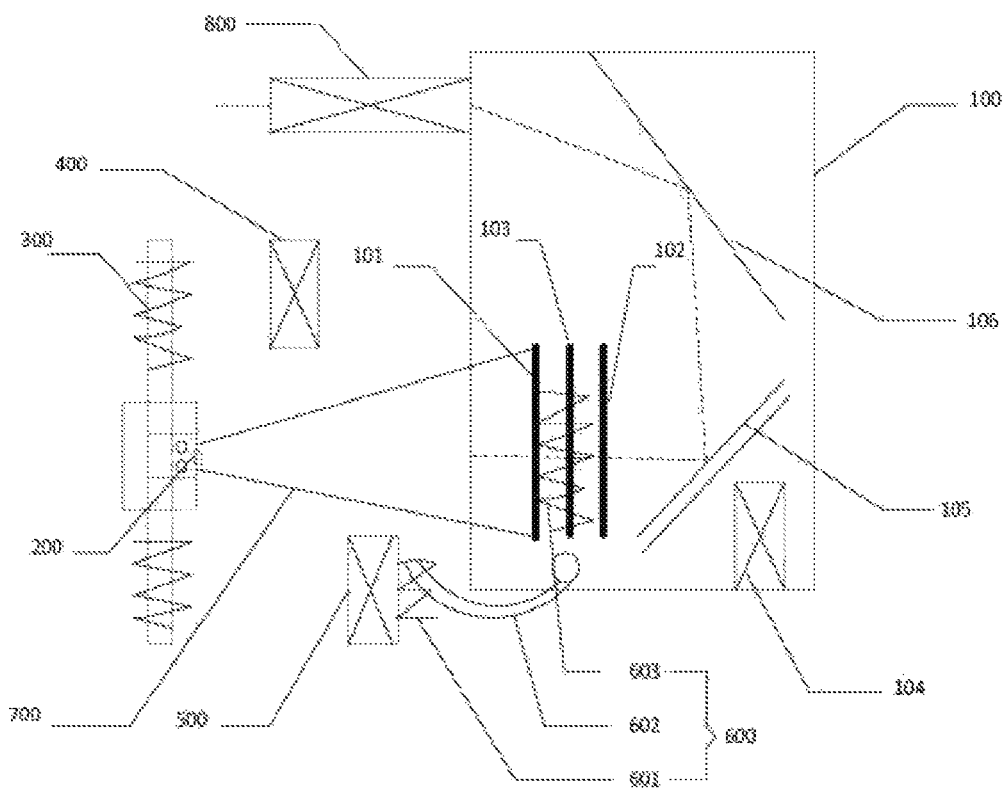
FIG. 1 is a cross-sectional structural schematic diagram of a fully sealed liquid crystal projection optical unit device with a high-efficiency heat dissipation function according to an embodiment of the present invention.

Hermetically sealed housing 100; Light resource 200; First heat pipe radiator module 300; First heat dissipation fan 400;

Second heat dissipation fan 500; First optical module 101; Second optical module 102; Liquid crystal screen 103;

Second heat pipe radiator module 600; First heat dissipation fin 601; Heat pipe 602; Second heat dissipation fin 603;

Light cone light guide body 700; Driving fan 104; First reflector 105; Second reflector 106; and Projection lens set 800.

DETAILED DESCRIPTION OF THE EMBODIMENTS

In order to make the objectives, technical solutions and advantages of embodiments of the present invention clearer, the technical solutions in the embodiments of the present invention will be clearly and completely described below with reference to the accompanying drawings for the embodiments of the present invention. Apparently, the described embodiments are some of, rather than all, the embodiments of the present invention. Based on the embodiments of the present invention, all the other embodiments obtained by those of ordinary skill in the art without any inventive efforts should fall within the scope of protection of the present invention.

It should be noted that similar reference signs and letters refer to similar items in the following drawings. Therefore, once a specific item is defined in one of the drawings, it need not be further defined and explained in subsequent drawings. Moreover, in the description of the present invention, the terms "first", "second" and the like are used for distinguishable description only, and should not be construed as indicating or implying the relative importance.

In the present invention, the terms "installed", "connected", "connection", "fixed", etc. should be understood in a broad sense, unless otherwise explicitly specified or defined, for example, it may be a fixed connection, a detachable connection or an integrated connection; may be a mechanical connection or an electrical connection; and may be a direct connection or an indirect connection through an intermediate medium, or may be a communication between the interior of two elements or the interaction of two elements. For those of ordinary skill in the art, the specific meaning of the terms mentioned above in the present invention should be construed according to specific circumstances.

Figure 2:
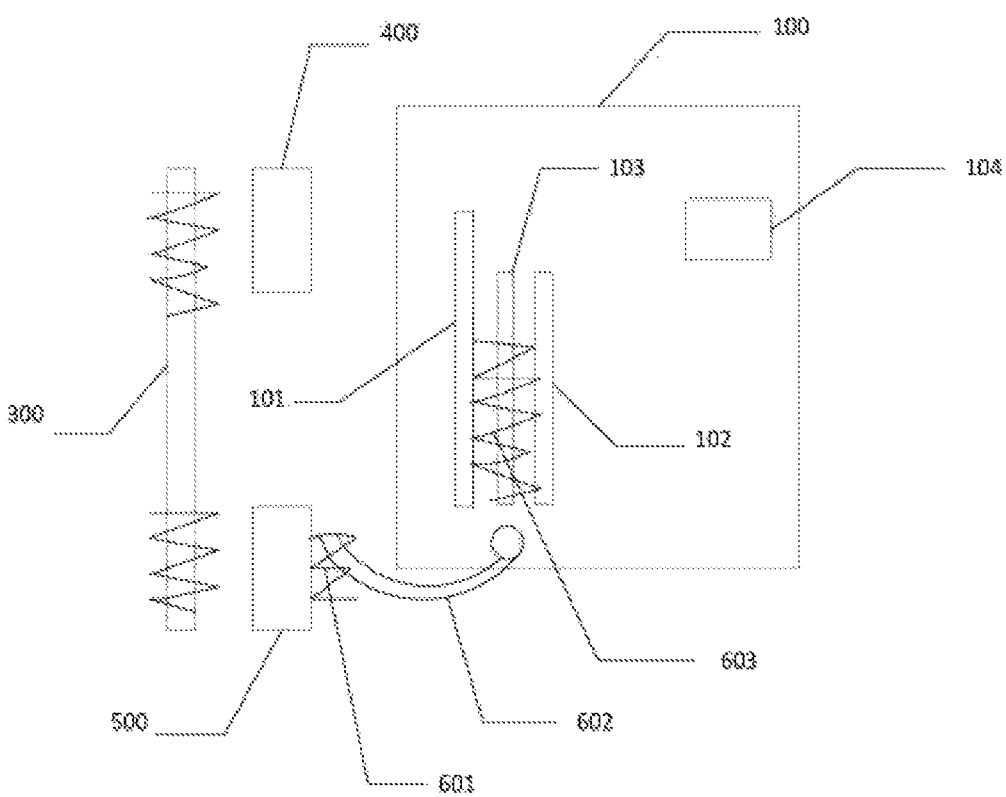
FIG. 2 is a top view of a fully sealed liquid crystal projection optical unit device with a high-efficiency heat dissipation function according to an embodiment of the present invention.

As shown in FIGS. 1 and 2, a fully sealed liquid crystal projection optical unit device with a high-efficiency heat dissipation function provided by an embodiment of the present invention may comprise a hermetically sealed housing 100, a light source 200, a first heat pipe radiator module 300, a first heat dissipation fan 400, a second heat dissipation fan 500, a first optical module 101, a second optical module 102, a liquid crystal panel 103, a second heat pipe radiator component 600, etc. The hermetically sealed housing 100 has an accommodation space therein. The light source 200, the first heat pipe radiator module 300, the first heat dissipation fan 400 and the second heat dissipation fan 500 are respectively disposed outside the hermetically sealed housing 100. The first optical module 101, the second optical module 102 and the liquid crystal screen 103 are installed inside the hermetically sealed housing 100, and the liquid crystal screen 103 is located between the first optical module 101 and the second optical module 102. In addition, the second heat pipe radiator module 600 comprises a first heat dissipation fin 601, a heat pipe 602 and a second heat dissipation fin 603.

Specifically, the light source 200 is installed on the first heat pipe radiator module 300, the first heat dissipation fan 400 and the second heat dissipation fan 500 are respectively installed near the first heat pipe module 300 to dissipate heat from the first heat dissipation module 300, and the first heat dissipation fan 400 and the second heat dissipation fan 500 are located on an inner side of the first heat pipe heat radiator module 300.

The first heat dissipation fin 601 is fixedly installed outside the hermetically sealed housing 100, and the second heat dissipation fan 500 is in communication with the first heat dissipation fin 601 through an air duct. The first heat dissipation fin 601 is in communication with the second heat dissipation fin 603 directly or through the heat pipe 602. The second heat dissipation fan 500 dissipates the heat from the first heat dissipation fin 601 so as to dissipate the heat from the heat pipe 602 and the first heat dissipation fin 601. Through the above heat dissipation method, the heat of the second heat pipe radiator module 600 is dissipated in a series manner, and is further dissipated out of the fully sealed liquid crystal projection optical unit device by means of the first heat pipe radiator module 300.

The second heat dissipation fin 603 is located at sides of the first optical module 101, the second optical module 102 and the liquid crystal panel 103. Convection air is blown from the other sides of the first optical module 101 and the second optical module 102, and absorbs the heat from the first optical module 101 and the second optical module 102 to become a high-temperature gas. The high-temperature gas passes through the second heat dissipation fin 603 to transfer the heat to the second heat dissipation fin 603, and the heat on the second heat dissipation tin 603 is transferred to the first heat dissipation fin 601 by means of the heat pipe 602.

The light source 200 is further coupled to the first optical module 101 by means of a light cone light guide body 700. The light source 200 is preferably an LED light source 200.

In order to enhance the internal circulation of air flow within the hermetically sealed housing 100, in this embodiment, a driving fan 104 is further installed inside the hermetically sealed housing 100.

In this way, the internal heat can be transferred to the outside in a hermetically sealed manner and subjected to enhanced heat dissipation at the outside, so that the radiation heat received by the first optical module 101 and the second optical module 102 from the LED light and the LED light source can be transferred to the outside. The heat dissipation can be performed without exchange of heat dissipation media, which can avoid bringing in dust. At the same time, the noise of the driving fan 104 for internal circulation is blocked or reduced, so as to improve the use experience effect of the whole machine.

A first reflector 105 and a second reflector 106 are further installed inside the hermetically sealed housing 100, and the first reflector 105 is disposed close to the second optical module 102. A projection lens set 800 is further installed to an outer wall of the hermetically sealed housing 100, the second reflector 106 is disposed near the projection lens set 800, the first heat dissipation fan 400 is disposed below the projection lens she 800, the projection lens set 800 forms a hermetically sealed space together with the hermetically sealed housing 100 through an opening of the hermetically sealed housing 100. In this way, the enclosure of the imaging system inside the fully sealed liquid crystal projection optical unit device can be implemented, the noise is effectively reduced, and the dust-proof effect is improved.

It should be noted that, in this embodiment, the first reflector 105 and the second reflector 106 are not necessarily required, but are an optical expression in the specific implementation process.

Further, the second heat dissipation fan 500 and the first heat dissipation fan 400 are respectively connected in series with the first heat dissipation fin 601. During implementation, the second heat dissipation fan 500 absorbs low-temperature external cooling air, and the cooling air passes through the first heat dissipation fins 601 to achieve high-efficiency heat exchange, and then passes through the first heat pipe radiator module 300, which can also perform heat exchange well. Therefore, by means of series heat dissipation, the second heat dissipation fan 500 can simultaneously dissipate the heat from the first heat dissipation fin 601 and the first heat pipe radiator module 300.

Further, the first heat dissipation fan 400 can also be connected in series with the first heat dissipation fin 601 through an air path.

In order to achieve better form arrangement, the fully sealed liquid crystal projection optical unit device comprises an air duct disposed between the first heat dissipation fan and the second heat dissipation fan 400, 500 and the first heat dissipation fin 601.

In this embodiment, the hermetically sealed housing 100 can be made of a plastic material, can also be made of a metal material, and can also be made of a mixed material of plastic and metal.

The second heat pipe radiator module 600 can also be simplified into a common heat dissipation fin logic structure, that is, the second heat dissipation fin 603 is installed inside the hermetically sealed housing 100, the second heat dissipation fin 603 is directly fused with the first heat dissipation fin 601, and the first heat dissipation fin 601 is exposed out of the hermetically sealed housing 100. The heat pipe 602 is omitted in the above implementation, which facilitates reducing cost.

In summary, compared with the prior art, the present invention has the beneficial effects as follows.

Firstly, the first heat dissipation fin 601 is fixedly installed to the outer wall of the hermetically sealed housing 100 and is close to the second heat dissipation fan 500, the second heat dissipation fan 500 is in communication with the second heat dissipation fin 603 through the heat pipe 602, the second heat dissipation fin 603 is located on inner sides of the first optical module 101, the second optical module 102 and the liquid crystal screen 103 and are fixedly installed to the inner wall of the hermetically sealed housing 100 and located inside the hermetically sealed housing 100, thereby achieving heat transfer from the inside to the outside.

Secondly, the first heat pipe radiator module 300 is installed near the light source 200, and the first heat dissipation fan 400 and the second heat dissipation fan 500 are respectively installed between the first heat pipe radiator module 300 and the second heat pipe radiator module 600, so that by means of active heat dissipation of the first heat dissipation fan 400 and the second heat dissipation fan 500, the heat of the second heat pipe radiator module 600 is absorbed and then transferred to the outside by means of the first heat pipe radiator module 300. The active heat dissipation is implemented in a series manner, on the one hand, it is possible to achieve no heat accumulation, and on the other hand, it is possible to reduce costs and improve the product's form effect.

In addition, the hermetically sealed housing 100 having an accommodation space therein is used, and the first optical module 101, the second optical module 102, the liquid crystal panel 103, the first reflector 105, the second reflector 106 and the driving fan 104 for internal circulation, etc. are installed inside the hermetically housing 100; therefore, the enclosure of the imaging system inside the hermetically sealed liquid crystal projection optical unit device can be implemented.

Finally, it should be noted that in this embodiment, by means of calculating the heat in the fully sealed liquid crystal projection optical unit device, the radiator size and the fan speed of the fully sealed liquid crystal projection optical unit device can be controlled according to the calculated results, thereby achieving form control and noise control.

The foregoing description is merely illustrative of the preferred embodiments of the present invention and is not intended to limit the present invention, and various changes and modifications may be made by those skilled in the art. Any modification, equivalent substitution, improvement, and the like made within the spirit and principle of the present invention shall be included into the protection scope of the present invention.

What is claimed is:

1. A fully sealed liquid crystal projection optical unit device with a high-efficiency heat dissipation function, comprising: a hermetically sealed housing, wherein an accommodation space is provided in the hermetically sealed housing; a light source, a first heat pipe radiator module, a first heat dissipation fan and a second heat dissipation fan, wherein the light source, the first heat pipe radiator module, the first heat dissipation fan and the second heat dissipation fan are disposed outside the hermetically sealed housing; a first optical module, a second optical module, and a liquid crystal screen located between the first optical module and the second optical module, wherein the first optical module, the second optical module and the liquid crystal screen are installed inside the hermetically sealed housing; and a second heat pipe radiator module comprising a first heat dissipation fin, a heat pipe and a second heat dissipation fin;

wherein, the first heat pipe radiator module is installed beside the light source, the first heat dissipation fan and the second heat dissipation fan are installed between the light source and the hermetically sealed housing, respectively; the first heat dissipation fan and the second heat dissipation fan are located on an inner side of the first heat pipe radiator module, the first heat dissipation fin is fixedly installed outside the hermetically sealed housing, the second heat dissipation fan is in communication with the first heat dissipation fin through an air duct, the first heat dissipation fin is in communication with the second heat dissipation fin directly or through the heat pipe, the second heat dissipation fin is located at sides of the first optical module, the second optical module and the liquid crystal screen, and the second heat dissipation fin is fixedly installed to an inner wall of the hermetically sealed housing, and the light source is coupled to the first optical module through a light cone guide body.

2. The fully sealed liquid crystal projection optical unit device with the high-efficiency heat dissipation function according to claim 1, wherein, a driving fan for an internal circulation is further installed inside the hermetically sealed housing, and the driving fan is configured to drive the internal circulation of an air flow within the hermetically sealed housing.

3. The fully sealed liquid crystal projection optical unit device with the high-efficiency heat dissipation function according to claim 1, wherein, a first reflector and a second reflector are further installed inside the hermetically sealed housing, and the first reflector is disposed next to the second optical module.

4. The fully sealed liquid crystal projection optical unit device with the high-efficiency heat dissipation function according to claim 3, wherein, a projection lens set is further installed on an outer wall of the hermetically sealed housing, the projection lens set is fixed to the hermetically sealed housing through an opening provided in the hermetically sealed housing, the second reflector is disposed next to the projection lens set, and the first heat dissipation fan and the second heat dissipation fan are disposed under the projection lens set.

5. The fully sealed liquid crystal projection optical unit device with the high-efficiency heat dissipation function according to claim 1, wherein, both of the first heat dissipation fan and the second heat dissipation fan are connected in series to the first heat dissipation fin to implement an active heat dissipation.

6. The fully sealed liquid crystal projection optical unit device with the high-efficiency heat dissipation function according to claim 5, further comprising the air duct disposed between the second heat dissipation fan and the first heat dissipation fin.

7. The fully sealed liquid crystal projection optical unit device with the high-efficiency heat dissipation function according to claim 5, wherein, a first end of the air duct is disposed on the first heat dissipation fan and the second heat dissipation fan, respectively, and a second end of the air duct is in communication with the first heat dissipation fin, so as to enhance a heat dissipation.

8. The fully sealed liquid crystal projection optical unit device with the high-efficiency heat dissipation function according to claim 1, wherein, the hermetically sealed housing is made of a plastic material and/or a metal material.

9. The fully sealed liquid crystal projection optical unit device with the high-efficiency heat dissipation function according to claim 1, wherein, the light source is an LED light source.

10. The fully sealed liquid crystal projection optical unit device with the high-efficiency heat dissipation function according to claim 2, wherein, the hermetically sealed housing is made of a plastic material and/or a metal material.

11. The fully sealed liquid crystal projection optical unit device with the high-efficiency heat dissipation function according to claim 3, wherein, the hermetically sealed housing is made of a plastic material and/or a metal material.

12. The fully sealed liquid crystal projection optical unit device with the high-efficiency heat dissipation function according to claim 4, wherein, the hermetically sealed housing is made of a plastic material and/or a metal material.

13. The fully sealed liquid crystal projection optical unit device with the high-efficiency heat dissipation function according to claim 5, wherein, the hermetically sealed housing is made of a plastic material and/or a metal material.

14. The fully sealed liquid crystal projection optical unit device with the high-efficiency heat dissipation function according to claim 6, wherein, the hermetically sealed housing is made of a plastic material and/or a metal material.

15. The fully sealed liquid crystal projection optical unit device with the high-efficiency heat dissipation function according to claim 2, wherein, the light source is an LED light source.

16. The fully sealed liquid crystal projection optical unit device with the high-efficiency heat dissipation function according to claim 3, wherein, the light source is an LED light source.

17. The fully sealed liquid crystal projection optical unit device with the high-efficiency heat dissipation function according to claim 4, wherein, the light source is an LED light source.

18. The fully sealed liquid crystal projection optical unit device with the high-efficiency heat dissipation function according to claim 5, wherein, the light source is an LED light source.

19. The fully sealed liquid crystal projection optical unit device with the high-efficiency heat dissipation function according to claim 6, wherein, the light source is an LED light source.

\* \* \* \* \*